United States Patent [19]
Eitan et al.

[11] Patent Number: 6,133,095
[45] Date of Patent: Oct. 17, 2000

[54] METHOD FOR CREATING DIFFUSION AREAS FOR SOURCES AND DRAINS WITHOUT AN ETCH STEP

[75] Inventors: Boaz Eitan, Ra'anana; Israel Rotstein, Haifa, both of Israel

[73] Assignees: Saifun Semiconductors Ltd.; Tower Semiconductors Ltd., both of Israel

[21] Appl. No.: 09/245,811

[22] Filed: Feb. 4, 1999

[51] Int. Cl.[7] .................................. H01L 21/8247
[52] U.S. Cl. ............................ 438/261; 438/262
[58] Field of Search ................... 438/261–263; 257/314–316

[56] References Cited

U.S. PATENT DOCUMENTS

| | | | |
|---|---|---|---|
| 5,075,245 | 12/1991 | Woo et al. | 438/262 |
| 5,418,176 | 5/1995 | Yang et al. | 438/262 |
| 5,553,018 | 9/1996 | Wang et al. | 365/185.01 |
| 5,599,727 | 2/1997 | Hakozaki et al. | |
| 5,656,513 | 8/1997 | Wang et al. | 438/262 |
| 5,801,076 | 9/1998 | Ghneim et al. | 438/261 |
| 5,966,603 | 10/1999 | Eitan | 438/258 |

OTHER PUBLICATIONS

"Ion Implanation in Silicon" article by K.A. Pickar, found in a book "Applied Solid State Science," vol. 5, R. Wolfe, Ed., Academic Press, New York, 1975.

Primary Examiner—Richard Booth
Attorney, Agent, or Firm—Skjerven Morrill MacPherson LLP; Alan H. MacPherson

[57] ABSTRACT

A method for manufacturing a memory array having a plurality of memory cells thereon and diffusion areas therebetween includes the steps of laying down a layer of silicon nitride, defining the diffusion areas and creating diffusion oxides over the diffusion areas. Both steps of laying down and defining occur without etching any part of the layer of silicon nitride. The step of creating diffusion oxides includes the steps of creating porous silicon nitride from portions of the silicon nitride layer wherever diffusion oxides are desired (typically by laying down photoresist in a desired pattern and bombarding the silicon nitride layer with ions) and oxidizing both the porous silicon nitride and the silicon substrate through the porous silicon nitride thereby to create silicon oxy-nitride and silicon dioxide, respectively. The present invention also includes a semiconductor chip having diffusion or bit line oxides formed of at least silicon oxy-nitride.

7 Claims, 3 Drawing Sheets

METHOD FOR CREATING DIFFUSION AREAS FOR SOURCES AND DRAINS WITHOUT AN ETCH STEP

FIELD OF THE INVENTION

The present invention relates generally to methods of manufacturing memory arrays having memory cells with silicon nitride layers therein and to the steps of creating diffusion areas for sources and drains in particular.

BACKGROUND OF THE INVENTION

There are many types of transistors all of whose particular shape and composition are chosen for the type of operation the transistor is to perform. Many transistors have silicon nitride (or just "nitride") layers therein. For example, a simple n-channel transistor is formed of a semiconductor substrate, a dielectric and a conductive layer over the dielectric layer. The dielectric layer is typically formed of three layers, a silicon oxide (or just "oxide") layer on the substrate, a nitride layer over the oxide layer and an oxide layer covering the nitride layer. This type of dielectric is known as an ONO (oxide-nitride-oxide) dielectric.

ONO can be found in other types of transistors. They are common in erasable programmable read only memory (EPROM) cells, electrically erasable programmable read only memory (EEPROM) cells and in nitride read only memory (NROM) cells. In the latter, the cell is formed of the ONO layer on the substrate with a polysilicon layer over the ONO layer.

The process of creating a cell is shown in FIGS. 1A, 1B and 1C, to which reference is now made. The ONO layers 10, 12 and 14 must be laid down on the p-type silicon substrate 16 and then cut (or etched) to the desired size and shape. The etching is produced by first patterning a layer of photoresist 18 on top of the ONO layer in the places where the ONO is desired. An etch operation is then performed, to remove the upper oxide and nitride layers 14 and 12, respectively, but the etch affects only the places where there is no photoresist. The output of the etch operation is a substrate with cells 20 of ONO.

As shown in FIG. 1B, an implant operation occurs (shown by arrows 30) which implants ions, such as Arsenic or Phosphorous, into the areas between the cells 20. This creates n-type source and/or drain areas 32 (FIG. 1 B) for the memory array cells in the p-type silicon substrate 16. If the source and/or drain areas are formed into lines, as is common for EPROM, EEPROM and NROM arrays, they are called the "diffusion bit lines" or "bit lines". The term "diffusion area" will be used to refer to sources and drains and the term "bit line" will be used throughout to describe diffusion bit lines and diffusion areas not yet formed into bit lines.

The photoresist 18 is removed, after which a thick bit line oxide 24 is then grown (FIG. 1C) between neighboring cells 20 to protect bit lines 32 and to electrically isolate neighboring cells 20 from each other.

It is also known to implant the bit lines 32 through the ONO layers 10, 12 and 14 after patterning with photoresist 18. The ONO layers 10, 12 and 14 are then etched, to remove the relevant sections of nitride layer 12, the photoresist 18 is removed and bit line oxide 24 is grown. Without the removal of nitride layer 12, bit line oxide 24 cannot be grown since the presence of nitride prevents oxidation.

The plasma etch is not a clean operation and, if enough contamination is left on the substrate 16 or on the side walls of the ONO, then the cell performance is degraded. Furthermore, the etching operation is not exact and, often, the etch can penetrate the substrate 16. This can ruin the electrical operation of the affected cell.

SUMMARY OF THE INVENTION

An object of the present invention is to provide an improved method for manufacturing diffusion bit lines in memory arrays.

There is therefore provided, in accordance with a preferred embodiment of the present invention, a method for manufacturing a memory array having a plurality of memory cells thereon and diffusion areas therebetween. The method includes the steps of laying down a layer of silicon nitride, defining the diffusion areas and creating diffusion oxides over the diffusion areas. Both steps of laying down and defining occur without etching any part of the layer of silicon nitride. Additionally, in accordance with a preferred embodiment of the present invention, the step of creating diffusion oxides includes the steps of creating porous silicon nitride from portions of the silicon nitride layer wherever diffusion oxides are desired and oxidizing the silicon substrate through the porous silicon nitride thereby to create silicon dioxide, during this oxidation the porous silicon nitride is oxidized thereby to transform the porous silicon nitride into silicon oxy-nitride.

Moreover, in accordance with a preferred embodiment of the present invention, the step of creating porous silicon nitride includes the step of laying down photoresist in a desired pattern and bombarding the silicon nitride layer with ions.

Furthermore, in accordance with a preferred embodiment of the present invention, the steps of implanting the diffusion areas and creating porous silicon nitride can be performed in a single implantation operation.

There is also provided, in accordance with a preferred embodiment of the present invention, a semiconductor chip including at least two neighboring memory cells having a diffusion area therebetween and a diffusion oxide over the diffusion area which is formed of at least silicon oxy-nitride.

The present invention also includes a semiconductor chip having diffusion areas formed of at least silicon oxy-nitride.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1A:
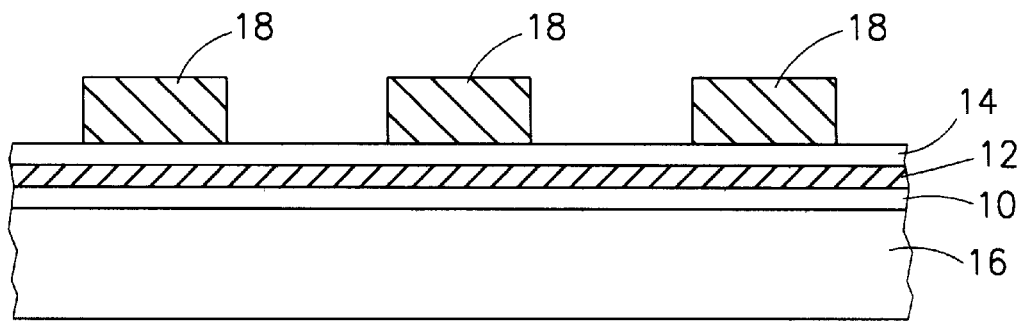
FIGS. 1A, 1B and 1C are schematic illustrations of a prior art method of manufacturing transistors having a nitride layer therein.
Figure 1B:
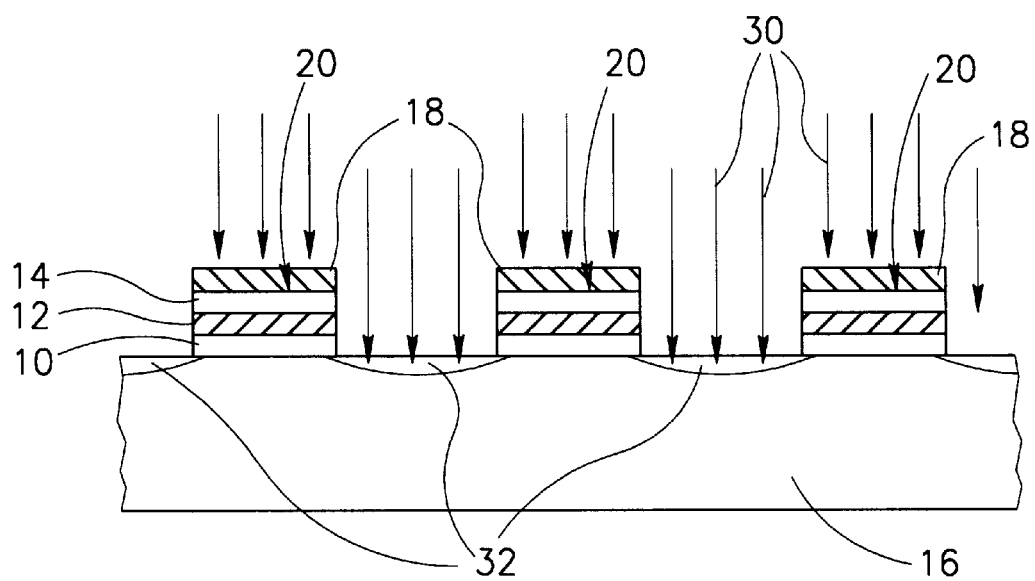
Figure 1C:
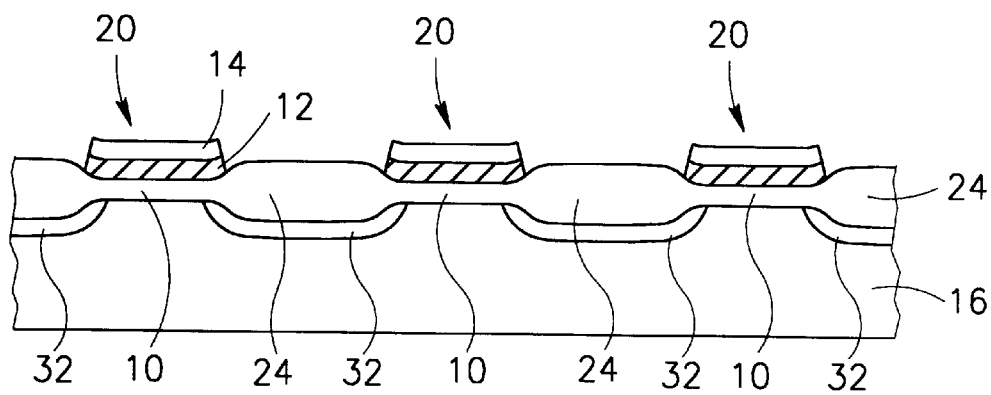

The present invention creates diffusion bit lines between neighboring transistors without having to etch away portions of the ONO layers. It can be implemented for any transistor technology which has oxide-nitride-oxide (ONO). Exemplary types of memory array transistors for which the present invention is applicable include nitride read only memory (NROM), erasable programmable read only memory (EPROM) and electrically erasable programmable read only memory (EEPROM) cells.

Reference is now made to FIGS. 2A, 2B, 2C, 2D and 2E which illustrate the manufacturing process for memory array transistors. As the materials used in the present invention are similar to those in the prior art, similar reference numerals will be used. Furthermore, the present invention uses many manufacturing steps, such as depositing the ONO layers, treatment of the photoresist 18, etc., which are well known in the art; accordingly, these will not be described in detail.

Figure 2A:
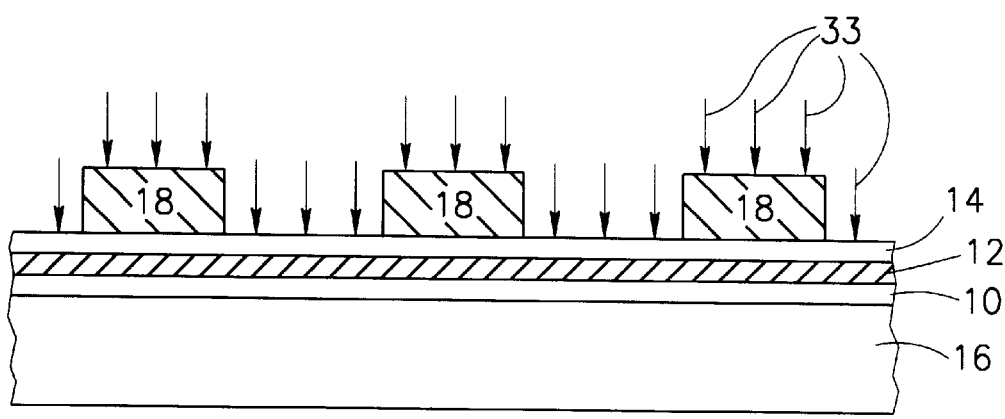
FIGS. 2A, 2B, 2C, 2D and 2E are schematic illustrations of a method of manufacturing memory array transistors having a nitride layer therein, constructed and operative in accordance with a preferred embodiment of the present invention.

As shown in FIG. 2A, the ONO layers 10, 12 and 14 are first laid down on the substrate 16, after which the chip is coated with photoresist 18 which is then patterned. In accordance with a preferred embodiment of the present invention, the ONO layers 10, 12 and 14 are not etched. Instead, the bit line implant occurs (shown by solid arrows 33) into the areas between the photoresist elements 18. This creates bit lines 32 through the ONO layers. The type of material to be implanted depends on the type of cells to be created. The implant dose and energy must be large enough to ensure sufficient passage of the material through the ONO layers in order to implant the material in substrate 16. The implant energy is a function of the ONO thickness, the desired ion dosage and the type of ion being implanted.

For example, for NROM cells whose ONO layers are 70, 75 and 90 Angstroms thick for the ONO layers 10, 12 and 14, respectively, the implant is of Arsenic at a dose of $3 \times 10^{15}$ per cm$^2$ and an energy of 80 KeV. This results in a "projection range" of 200 Angstroms under the silicon interface, where "projection range" is the depth of the implant in substrate 16 at which the majority of the ions stop, and 95% of the implanted dose penetrating into the silicon substrate 16.

Figure 2B:
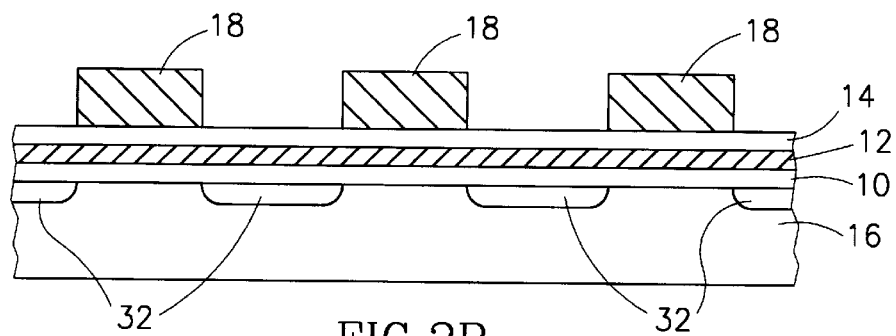

FIG. 2B shows the results of the implant operation of FIG. 2A. The implanted material is located in the bit lines 32 which are found in the substrate 16 wherever there were no photoresist elements 18 over the ONO layers.

Figure 2C:
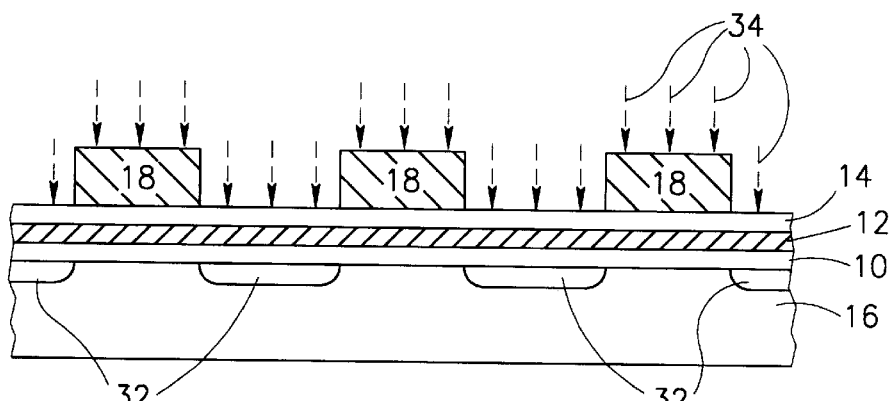
Figure 2D:
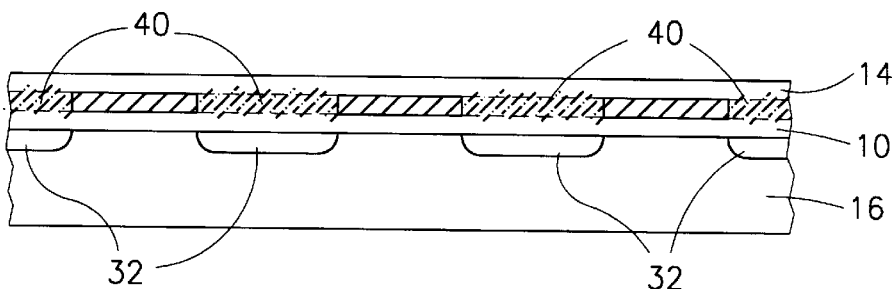

In accordance with a preferred embodiment of the present invention, another implant operation, shown in FIG. 2C with dashed arrows 34, is then performed while the photoresist elements 18 remain; however, this implant is 15 directed toward nitride layer 12. Accordingly, it is a low energy and high dose implant operation. For NROM arrays, it is of heavy ions, such as Arsenic or Argon. The type of material used is irrelevant as long as it stays within the ONO layer.

The purpose of the implant is to bombard the silicon nitride layer so as to break it up, thereby producing porous silicon nitride which can be penetrated by oxygen. This process is described in the article by K. A. Pickar, "Ion Implantation in Silicon", found in the book, *Applied Solid State Science*, Vol .5, R. Wolfe, Ed., Academic Press, New York, 1975. The article is incorporated herein by reference. The process typically also affects some portions of the neighboring oxide layers 10 and 14. Thus, the result, as shown schematically in FIG. 2D after removal of the photoresist, is porous ONO elements 40 found only in the areas of the nitride layer 12 where the photoresist 18 was not previously present (i.e. over the bit lines 32).

For the previous NROM example, the second implant operation is of Arsenic at an energy of 15 Kev and a dose of $3 \times 10^{15}$ per cm$^2$. The projection range of the Arsenic for this implant is generally coincident with the center of nitride layer 12 and, accordingly, only about 5% of the Arsenic dose penetrates into silicon substrate 16. After the implant, the Arsenic concentration in nitride layer 12 is $3 \times 10^{21}$ per cm$^3$ and it is this high concentration of Arsenic that is responsible for the break-up of the nitride layer.

Figure 2E:
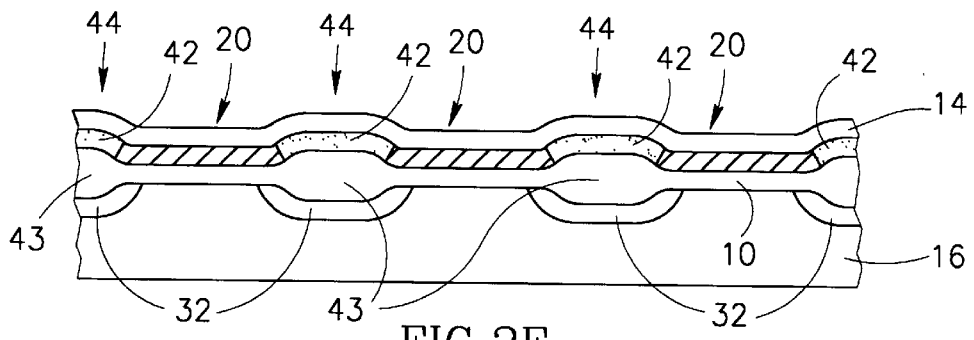

Since the nitride layer is no longer whole, it cannot protect the silicon substrate 16 from oxidation. In accordance with a preferred embodiment of the present invention, a thermal oxidation operation is now performed. The oxygen penetrates through the porous ONO 40 to bit lines 32 underneath, thereby oxidizing the silicon of bit lines 32 to create thick silicon dioxide elements 43 (FIG. 2E). At the same time, the penetrating oxygen oxidizes the porous nitride elements of ONO 40, thereby creating silicon oxynitride ("oxy-nitride") elements 42.

It is noted that the oxidation of the porous nitride elements rebuilds them and ensures their integrity. Furthermore, oxy-nitride, as known in the art, does not form a barrier to oxidation nor does it collect charge, both of which nitride does. Thus, oxy-nitride acts as an isolation unit and can be further oxidized, if necessary.

It will be appreciated that, wherever the porous nitride existed, a novel bit line oxide 44 in the form of thick silicon dioxide 43 and an oxy-nitride element 42, is now present. Novel bit line oxide 44 functions as a prior art bit line oxide though it is formed of different elements. It both protects bit lines 32 and isolates neighboring ONO sections 20.

It will be appreciated that bit line oxides 44 are generated without an etch operation. Furthermore, the bit line oxides 44 are "self-aligned" to the ONO sections 20 in that they are created with the same photoresist layer as the ONO sections 20. Finally, the present invention does not allow any contamination due to plasma etching between ONO sections 20 and bit line oxides 44 since etching never causes the two to be separated.

For NROM, EPROM and EEPROM arrays, one or more polysilicon layers are placed over the ONO sections 20.

In an alternative embodiment of the present invention, the two bit line implant steps (FIGS. 2A and 2C) are implemented in a single implant step such that the implant will stop at the nitride layer 12 and at the substrate 16. For this embodiment, the implanted material must be a donor dopant, to implant the bit lines, and it must be heavy, to break up the nitride sections. One such material is Arsenic.

When there is only one implant step, either bottom oxide 10 should be thin or the energy level of the implant should be quite high since the energy level is a function largely of the thickness of bottom oxide 10. This requires that the center of nitride layer 12 be no further than one standard deviation from the projection range of the implant.

It will be appreciated that the present invention provides a tradeoff between the ONO thickness and the number of implant steps. If the cell requires a thick ONO layer, then the implant operation must be separated into two steps, one for implanting the bit lines and one for breaking the nitride layer. However, if the cell can function with a thin bottom oxide, then a single implant operation can be used. The latter is possible also if a high energy implant is acceptable.

It will be appreciated by persons skilled in the art that the present invention is not limited by what has been particularly shown and described hereinabove. Rather the scope of the invention is defined by the claims that follow:

We claim:

1. A method for manufacturing a memory array having a plurality of memory cells thereon and diffusion areas therebetween, said memory cells having silicon nitride therein, the method comprising the steps of:

laying down a layer of silicon nitride;

defining said diffusion areas without etching any part of said layer of silicon nitride; and creating diffusion oxides over said diffusion areas without etching any part of said layer of silicon nitride.

2. A method according to claim 1 and wherein said step of creating diffusion oxides includes the steps of:

creating porous silicon nitride from portions of said silicon nitride layer wherever diffusion oxides are desired; and oxidizing said porous silicon nitride and a silicon substrate through said porous silicon nitride thereby respectively creating silicon oxy-nitride elements and silicon dioxide elements which together form said diffusion oxides.

3. A method according to claim 2 and wherein said second step of creating includes the step of laying down photoresist in a desired pattern followed by the step of bombarding said silicon nitride layer with ions.

4. A method according to claim 3 and wherein said step of defining occurs after said step of laying down photoresist and before said step of bombarding.

5. A method for manufacturing a memory array having a plurality of memory cells thereon and diffusion areas therebetween, said memory cells having silicon nitride therein, the method comprising the steps of:

laying down a layer of silicon nitride;

in one step, implanting said diffusion areas and creating porous silicon nitride from portions of said silicon nitride layer over said diffusion areas without etching any part of said layer of silicon nitride; and creating diffusion oxides from at least said porous silicon nitride.

6. A method according to claim 5 and wherein said step of creating diffusion oxides includes the step of oxidizing said porous silicon nitride and a silicon substrate through said porous silicon nitride thereby respectively creating silicon oxy-nitride elements and silicon dioxide elements which together form said diffusion oxides.

7. A method according to claim 5 and also including the step of laying down photoresist in a desired pattern prior to said step of implanting.

* * * * *